(12) United States Patent
Rothman

(10) Patent No.: US 8,975,718 B2
(45) Date of Patent: Mar. 10, 2015

(54) AVALANCHE PHOTODIODE-TYPE SEMICONDUCTOR STRUCTURE WITH LOW RESPONSE TIME AND PROCESS FOR PRODUCING SUCH A STRUCTURE

(71) Applicant: Commissariat a l'Energie atomique et aux Ene Alt, Paris (FR)

(72) Inventor: Johan Rothman, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/143,425

(22) Filed: Dec. 30, 2013

(65) Prior Publication Data
US 2014/0183682 A1    Jul. 3, 2014

(30) Foreign Application Priority Data
Dec. 31, 2012    (FR) ...................... 12 62993

(51) Int. Cl.
| | |
|---|---|
| *H01L 31/10* | (2006.01) |
| *H01L 31/0296* | (2006.01) |
| *H01L 31/103* | (2006.01) |
| *H01L 31/107* | (2006.01) |
| *H01L 31/18* | (2006.01) |

(52) U.S. Cl.
CPC ...... *H01L 31/02966* (2013.01); *H01L 31/1032* (2013.01); *H01L 31/107* (2013.01); *H01L 31/1832* (2013.01)
USPC ........................................... 257/438; 438/87

(58) Field of Classification Search
CPC ..................... H01L 31/02966; H01L 31/1832; H01L 31/107; H01L 31/1032
USPC ........................................... 257/438; 438/87
See application file for complete search history.

(56) References Cited

U.S. PATENT DOCUMENTS

| | | |
|---|---|---|
| 2008/0067620 A1 | 3/2008 | Rothman |
| 2010/0233842 A1* | 9/2010 | Grein et al. ..................... 438/93 |
| 2011/0031401 A1 | 2/2011 | Mitra et al. |

FOREIGN PATENT DOCUMENTS

| | | |
|---|---|---|
| EP | 0 001 139 A1 | 3/1979 |
| EP | 0 163 546 A3 | 12/1985 |

(Continued)

OTHER PUBLICATIONS

U.S. Appl. No. 14/143,493, filed Dec. 30, 2013, Rothman.

(Continued)

*Primary Examiner* — Roy Potter
*Assistant Examiner* — Paul Patton
(74) *Attorney, Agent, or Firm* — Oblon, McClelland, Maier & Neustadt, L.L.P.

(57) ABSTRACT

The invention relates to an avalanche photodiode-type semiconductor structure (1) intended to receive electromagnetic radiation in a given wavelength. The structure comprises a first semiconductor zone (210) with a first type of conductivity with a first longitudinal face (201), said first zone (210) being made of mercury-cadmium telluride of the $Cd_xHg_{1-x}Te$ type with a cadmium proportion x that is varied. The structure (1) also comprises at least one second semiconductor zone (310) in contact with the first zone (210), and a third semiconductor zone (410) in contact with the second zone (310). The first zone (210) comprises a doping element, such as arsenic, of which the concentration is varied alternately in a direction substantially perpendicular to the first longitudinal face (201) between a so-called low concentration and a so-called high concentration. The invention also relates to a process for producing a structure (1) according to the invention.

11 Claims, 3 Drawing Sheets

(56) References Cited

FOREIGN PATENT DOCUMENTS

| EP | 0 325 532 A3 | 7/1989 |
|---|---|---|
| EP | 1 903 612 A1 | 3/2008 |
| EP | 2 284 895 A2 | 2/2011 |

OTHER PUBLICATIONS

U.S. Appl. No. 14/359,216, filed May 19, 2014, Mollard, et al.
French Preliminary Search Report issued Oct. 23, 2013, in French Application No. 12 62990 filed Dec. 31, 2012 (with English Translation of Categories of Cited Documents), 2 pages.
Anand Singh, et al., "HgCdTe avalanche photodiodes: A review", Optics & Laser Technology, vol. 43, No. 7, Mar. 7, 2011, 13 pages.
French Preliminary Search Report issued Aug. 30, 2013, in Patent Application No. FR 1262993 (with English Translation of Category of Cited Documents).
Johan Rothman, et al., "History-Dependent Impact Ionization Theory Applied to HgCdTe e-APDs", Journal of Electronic Materials, vol. 40, No. 8, 2011, pp. 1757-1768.

* cited by examiner

AVALANCHE PHOTODIODE-TYPE SEMICONDUCTOR STRUCTURE WITH LOW RESPONSE TIME AND PROCESS FOR PRODUCING SUCH A STRUCTURE

TECHNICAL FIELD

The invention relates to the field of light measurement and detection devices.

In recent years, the application of microelectronic production methods to direct gap semiconductor materials, such as gallium arsenide and indium phosphide, have made it possible to improve the performance of optoelectronic structures.

Thus, among these optoelectronic structures, the application of these technologies to the current avalanche photodiode technologies has made it possible to reduce their dark current, thus improving their sensitivity, and their response time. In spite of the low response time of these structures, research aimed at reducing the response time of avalanche photodiodes remains a current problem.

The invention therefore more specifically relates to an avalanche photodiode-type semiconductor structure with a low response time and to a process for producing such a structure.

PRIOR ART

Recent research studies on avalanche photodiodes based on mercury-cadmium telluride of the $Cd_xHg_{1-x}Te$ type such as those published by J. Rothman et al. in 2011 in the Journal of Electronic Material No 40, page 1757 have shown that such photodiodes have the special feature of having, when they are adapted for operating in the infrared range, a gain by selective impact ionization since only the electrons are multiplied.

A structure having such a characteristic generally comprises:
- a first semiconductor zone suitable for absorbing electromagnetic radiation by generating electron-hole pairs, the first zone being made of a semiconductor layer that extends longitudinally,
- a second semiconductor zone in contact with the first zone, the second zone being suitable for allowing, during operation of the structure, a multiplication of the carriers generated in the first zone, the second zone being arranged in a second semiconductor layer that extends along the first layer,
- a third semiconductor zone enabling the carriers to be collected.

In such a structure, the first, second and third zones are all three made of mercury-cadmium telluride of the $Cd_xHg_{1-x}Te$ type with a cadmium proportion x of each of the semiconductor zones that is adapted with respect to the function provided by said zone.

By using mercury-cadmium telluride semiconductor zones, such a structure has, with respect to a conventional avalanche photodiode-type structure, improved performances with regard to both the signal-to-noise ratio, and therefore the sensitivity, and the response time of such a structure.

Nevertheless, even if such structures have improved characteristics with respect to structures made of a different material, they have the disadvantage of not enabling, in a conventional configuration, a variation in the forbidden energy gap in the first semiconductor zone, which could, for example, enable the response time of the structure to be improved.

In effect, according to this conventional configuration, the first zone has a first type of conductivity for which the majority carriers are electrons and are obtained by means of doping elements such as arsenic. For certain doping elements, such as arsenic, during the activation anneal necessary for activating these doping elements and releasing the carriers, cadmium and mercury interdiffuse in the zone in which said doping elements have been implanted. The result of this is that a zone made of mercury-cadmium telluride of the $Cd_xHg_{1-x}Te$ type comprising such doping elements, such as arsenic, has, after the activation anneal, a cadmium proportion x, and therefore a forbidden energy gap, that is substantially homogeneous. Thus, in such a structure, the first zone inevitably has a cadmium proportion x that is substantially constant over the entire zone.

DESCRIPTION OF THE INVENTION

The present invention is intended to overcome this disadvantage.

The invention is therefore intended to provide an avalanche photodiode-type structure comprising at least one first zone made of a mercury-cadmium telluride of the $Cd_xHg_{1-x}Te$ type with a cadmium proportion x that is varied over at least one dimension and comprising at least one doping element, such as arsenic, providing at least one carrier without the presence of the latter doping element significantly influencing the variation in the cadmium proportion x in said first zone.

To this effect, the invention relates to an avalanche photodiode-type semiconductor structure intended to receive electromagnetic radiation in a given wavelength and comprising:
- a first semiconductor zone, called an absorption zone, with a first type of conductivity having a first face intended to receive the electromagnetic radiation and a second face opposite the first face, said first zone being made of mercury-cadmium telluride of the $Cd_xHg_{1-x}Te$ type with a cadmium proportion x that is varied,
- at least one second semiconductor zone, called a multiplication zone, in contact on a first longitudinal face with the second face of the first zone, the second zone having a majority carrier concentration lower than that of the first zone, said second zone being adapted so as to provide a multiplication of carriers by impact ionization,
- a third semiconductor zone, called a collection zone, in contact with the second zone, said third zone having a second type of conductivity opposite the first type of conductivity and having a majority carrier concentration higher than that of the second semiconductor zone, the first zone comprising a doping element providing at least one majority carrier corresponding to the first type of conductivity, of which the concentration is varied alternately in a direction substantially perpendicular to the first longitudinal face between a so-called low concentration and a so-called high concentration.

The use of a first zone comprising a doping element concentration that is varied alternately in a direction substantially perpendicular to the first longitudinal face makes it possible to ensure that the diffusion of cadmium in said first zone during the activation anneal of the doping element remains low. In effect, since this diffusion is directly related to the high concentrations of doping element, such as arsenic, the parts of the first zone that have a low concentration of said doping element act as a barrier to the diffusion of cadmium. They enable the structure to have a cadmium proportion x that is varied along the direction substantially perpendicular to the first longitudinal face in spite of the use of a doping element providing a majority carrier of the first type of conductivity, such as arsenic.

Above and in the remainder of this document, by "cadmium proportion", we mean the proportion x of cadmium in a mercury-cadmium telluride of the $Cd_xHg_{1-x}Te$ type with value x corresponding to the proportion of cadmium with respect to mercury.

The second zone can have a majority carrier concentration at least 10 times lower than that of the first zone.

The third zone can have a majority carrier concentration at least 10 times greater than that of the second zone.

The first zone can comprise a cadmium proportion x that is reduced in the direction of the second zone along an axis substantially perpendicular to the first longitudinal face.

Such a variation in the cadmium proportion x in the first zone makes it possible to create an electric field along the first zone suitable for accelerating the diffusion in the direction of the second zone of carriers generated in the first zone. Such an acceleration of the diffusion of carriers in the first zone makes it possible to reduce the response time of the structure with respect to a structure not having such a variation in the cadmium proportion x in the first zone.

The low concentration of doping element can be substantially zero.

Such a low concentration makes it possible to limit the risk of diffusion of the cadmium during the activation anneal in the parts of the first zone comprising the low concentration of doping element. Thus, the structure can comprise a variation in the cadmium proportion x in the first zone at least at the parts of this first zone comprising the low concentration of doping element.

The alternation between the low concentration and the high concentration in the first zone can be substantially periodic.

Each period can comprise a first part corresponding to the high concentration and a second part corresponding to the low concentration, with the dimensional ratio between the first part and the second part in the direction substantially perpendicular to the longitudinal face being a maximum of 10.

Such a dimensional ratio between the first and the second part makes it possible to ensure a low series resistance. In effect, with such a dimensional ratio, the majority carriers provided by the second zone make it possible to ensure good conduction both in the second part and in the first part, ensuring good conduction over the entire thickness of the first zone.

The first zone can be in contact with the second zone by a region substantially free of doping element.

The region of the first zone by which the first zone is in contact with the second zone can comprise a cadmium proportion x that is varied in the direction of the second zone.

The doping element providing at least one majority carrier can be arsenic.

The doping element providing at least one majority carrier can be gold Au or antimony Sb.

The invention also relates to a process for producing a structure including the steps consisting of:
providing a support comprising a first semiconductor zone with a first type of conductivity having a first longitudinal face intended to receive the electromagnetic radiation and a second face opposite the first face, said first zone being made of mercury-cadmium telluride of the $Cd_xHg_{1-x}Te$ type with a cadmium proportion x that is varied, the first zone comprising a doping element of which the concentration is varied alternatively in the direction perpendicular to the first longitudinal face between a so-called low concentration and a so-called high concentration,
forming a second semiconductor zone in contact with the second face of the first zone, the second zone having a majority carrier concentration lower than that of the first zone, forming a third semiconductor zone in contact with the second zone, said third zone having a second type of conductivity opposite the first type of conductivity and having a majority carrier concentration greater than that of the second zone.

Such a process makes it possible to produce an avalanche photodiode-type structure comprising at least one first zone made of mercury-cadmium telluride of the $Cd_xHg_{1-x}Te$ type with a cadmium proportion x that is varied over at least one dimension.

The step of providing the first zone can include sub-steps consisting of:
providing a support comprising a longitudinal surface,
depositing, on the longitudinal surface of the support, mercury-cadmium telluride of the $Cd_xHg_{1-x}Te$ type by varying the cadmium proportion x and introducing the doping element into it with a concentration that is varied alternately in the direction substantially perpendicular to the longitudinal surface between a so-called low concentration and a so-called high concentration.

In the sub-step consisting of depositing the mercury-cadmium telluride in contact with the support, the doping element concentration can be varied substantially periodically.

The doping element providing at least one majority carrier can be arsenic.

The doping element providing at least one majority carrier can be gold Au or antimony Sb.

BRIEF DESCRIPTION OF THE DRAWINGS

The present invention will be easier to understand in view of the following description of embodiments, provided solely as an indication, and which are in no way limiting, with reference to the appended drawings, wherein.

Identical, similar or equivalent parts of the different figures have the same numeric references so as to facilitate reading from one figure to another.

The different parts shown in the figures are not necessarily shown according to a uniform scale, so that the figures are easier to read.

The different possibilities (alternatives and embodiments) must be understood as being non-mutually exclusive and are capable of being combined with one another.

DETAILED DESCRIPTION OF SPECIFIC EMBODIMENTS

Figure 1:
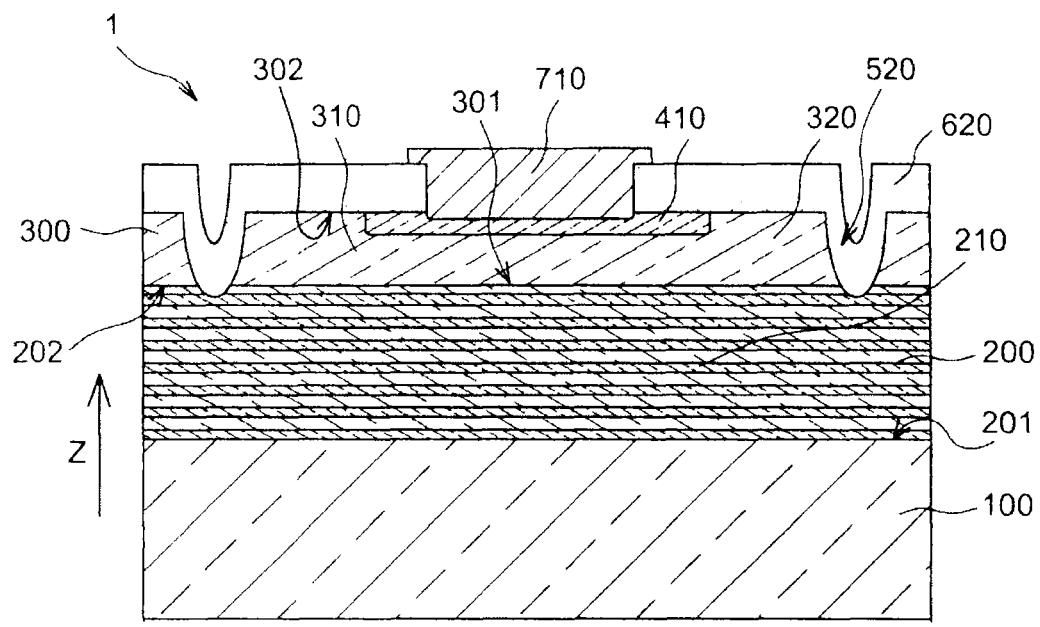
FIG. 1 shows a cross-section view of a structure according to a first embodiment of the invention.

FIG. 1 shows a semiconductor structure 1 according to a first embodiment, said structure 1 being intended for the detection and measurement of electromagnetic radiation of which the wavelength is within a given range of wavelengths.

To illustrate and facilitate the understanding of the operation of the structure according to the invention, the values and the materials that are cited above, when specified, concern a specific application of the invention for the detection and measurement of electromagnetic radiation of which the wavelength is within the near infrared wavelength range. Of course, the values and the materials concerning this application are provided only as an illustration and are not limiting.

Above and in the remainder of this document, by "near infrared wavelength range", we mean a range of wavelengths of between 1.5 μm and 5 μm.

A structure 1 according to the first embodiment of the invention comprises:
- a support 100,
- a first semiconductor zone 210 with a first type of conductivity having a first longitudinal face 201 intended to receive the electromagnetic radiation and a second face 202 opposite the first face 201, said first zone 210 comprising a forbidden energy gap suitable for promoting the absorption of the electromagnetic radiation by the first zone in the desired range,
- a second semiconductor zone 310 in contact on a first face 301 with the second face 202 of the first zone 210,
- a third semiconductor zone 410 in contact with the second zone 310, said third zone 410 having a second type of conductivity opposite the first type of conductivity,
- an electric contact 701 in contact with the third zone 410 and suitable for polarizing the third zone 410, the electric contact forming first polarization means,
- second polarization means, not shown, suitable for polarizing the first zone,
- a passivation layer 620 in contact with the second and the third zones 310, 410.

The support 100 is a support suitable for forming the first zone 210 and is at least partially transparent in the given wavelength range. Thus, the support 100 can be made of an insulating or semiconductor material of which the forbidden energy gap has an energy below the energy of the photons of a electromagnetic radiation of which the wavelength is within the given wavelength range.

The support 100 is made of a material suitable for supporting a mercury-cadmium telluride $Cd_xHg_{1-x}Te$, such as a zinc-cadmium telluride $Cd_xZn_{1-x}Te$.

In the specific application, the support 100 is a zinc-cadmium telluride $Cd_xZn_{1-x}Te$ with a cadmium proportion that is adapted so that the support 100 is designed for the formation of the first layer 200. Thus, for example, for a first layer 200 that is made of mercury-cadmium telluride $Cd_xHg_{1-x}Te$ with a cadmium proportion x of 0.2 at its contact with the support 100, the support 100 is a zinc-cadmium telluride $Cd_xZn_{1-x}Te$ with a cadmium proportion of 0.96.

The support 100 has a first and a second face, the first face being the face that is intended to receive the electromagnetic radiation.

The structure 1 also comprises a first semiconductor layer 200 in contact with the support 100. The first layer 200 extends substantially longitudinally along the second face of the support 100. The thickness of the first layer 200 corresponds to the direction substantially perpendicular to the longitudinal face 201 of the first layer 200.

The first layer 200 is made of mercury-cadmium telluride $Cd_xHg_{1-x}Te$ with, over its entire thickness, a forbidden energy gap that is suitable for allowing the absorption of electromagnetic radiation of which the wavelength is within the given wavelength range. Thus, the first layer 200 has, over its entire thickness, a cadmium proportion x adapted so that the forbidden energy gap of the first layer 200 is below the energy of the photons of a electromagnetic radiation of which the wavelength is in the given wavelength range.

Figure 2:
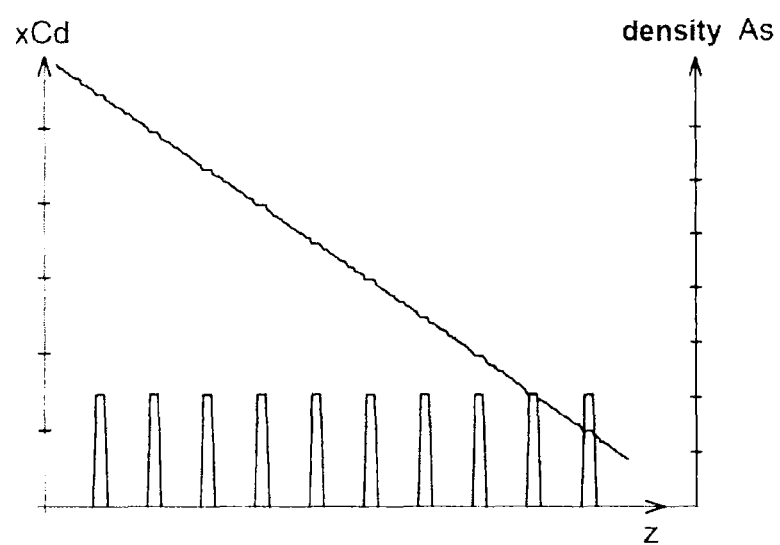
FIG. 2 shows a graph of the variations in cadmium and arsenic concentrations in a first semiconductor zone of a first structure as shown in FIG. 1.
Figure 3:
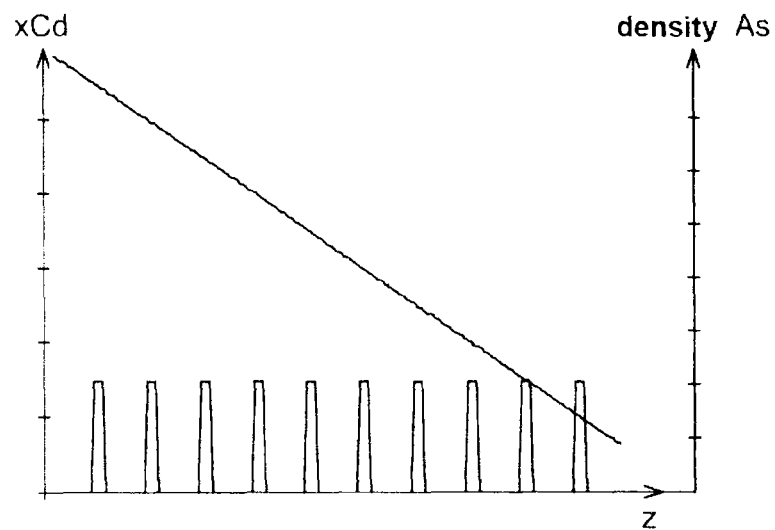
FIG. 3 shows a graph of the variations in cadmium and arsenic concentrations in the first semiconductor zone of a structure as shown in FIG. 1 during its production before the arsenic activation step.

To reduce the response time of the structure 1, the first layer 200 comprises a cadmium proportion x that is varied along its thickness between a maximum proportion and a minimum proportion of cadmium. The cadmium proportion in the first layer 200 is varied along its thickness substantially uniformly with, as is shown in FIG. 2, zones on which the cadmium proportion x does not vary.

Thus, in the specific application, the first layer 200 has a cadmium concentration x that varies between 0.6 near the support 100 and 0.2 near the second zone 310, and preferably 0.33 near the second zone 310.

The thickness of the first layer 200 is adapted so that a major part of the radiation received by the first face of the structure 1, at the first zone 210, is absorbed by the first zone 210.

The part of the first layer 200, in which the electron-hole pairs at the origin of the signal of the structure are formed, forms the first zone 210 of the structure 1.

The first layer 200 has a thickness of between 0.5 and 2 μm.

The first layer 200 has a first type of conductivity for which the majority carriers are electrons.

The majority carriers in the first layer 200 are provided by means of the doping element, which is arsenic. The arsenic concentration along the first layer 200 is varied alternately along the thickness of the first layer 200 between a so-called low concentration and a so-called high concentration. The alternation between the low concentration and the high concentration is substantially periodic.

According to another possibility of the invention, the majority carriers of the first layer 200, and therefore of the first zone 210, can be provided by means of a doping element other than arsenic, such as gold Au or antimony Sb. The configuration of a structure according to this other possibility of the invention is substantially identical to that of a structure in which the doping element is arsenic. The use, in the context of the invention, of a doping element other than arsenic therefore requires few adaptations within the abilities of a person skilled in the art, and is compatible with all of the embodiments of the invention presented in this document. Thus, for these reasons and in order to make the description of the invention clear and concise, no mention is made of doping elements other than arsenic in the remainder of this document, but this lack of discussion does not limit the scope of the invention to arsenic as the only doping element.

Each period comprises a first part corresponding to the high concentration and a second part corresponding to the low concentration with a dimensional ratio between the first part and the second part in the direction substantially perpendicular to the longitudinal face 201 being a maximum of 10 and typically less than 5.

The so-called low concentration is substantially zero in order to limit the risk of diffusion of the cadmium along the thickness of the first layer 200. Thus, the parts of the first zone 210 having a low-type concentration are of the unintentionally doped type.

By "unintentionally doped type", we mean that the majority carrier concentration of the parts of the first layer 200 that partially form the first zone 210 is that of a material in which doping elements have not intentionally been introduced, i.e. elements providing carriers. The value and type of carriers in a zone of the unintentionally doped type are linked to the process for forming said zone.

The so-called high arsenic concentration is preferably sufficient for the carriers provided by the parts corresponding to the high concentration to influence the parts corresponding to the low concentration. Thus, the arsenic concentration is adapted so that the majority carrier concentration of a material comprising such an arsenic concentration is more than 20 times that of this same material when it is of the intrinsic type.

In the first layer 200, the so-called high arsenic concentration, the period and the dimensional ratio between a part corresponding to the high concentration and a part corresponding to the low concentration in the direction substantially perpendicular to the first longitudinal face 201 are adapted so that the majority carrier concentration in the first layer 200 has a low series resistance.

According to a preferred possibility of the invention, the first zone 210 is in contact with the second zone 310 by a region substantially free of arsenic. According to this same possibility, the region of the first zone 210 by which the first zone 210 is in contact with the second zone 310 can comprise a cadmium proportion x that is varied in the direction of the second zone 310.

Thus, in the specific application, the first layer 200 has a mean majority carrier concentration of between $10^{16}$ and $4.10^{17}$ cm$^{-3}$.

The thickness of the first layer 200 is adapted so that a major part of the radiation received by the first face of the structure 1 at the first zone 210 is absorbed by the first zone 210.

In the specific application, the first layer 200 is made of a mercury-cadmium telluride $Cd_xHg_{1-x}Te$ of which the cadmium proportion x is between 0.33 and 0.6. With a cadmium proportion of 0.33 and 0.6, the first layer 200 is suitable for absorbing, at a temperature of 300 K, electromagnetic radiation in a wavelength range respectively below 3.7 μm and 1.8 μm.

In this same specific application, the first type of conductivity is of the conductivity type for which the majority carriers are holes. The majority carrier concentration in the first layer 200 is preferably between $10^{16}$ and $10^{17}$ cm$^{-3}$. According to this application, the first layer 210 has a thickness of between 0.5 and 2 μm.

The part of the first layer 210 in which the electron-hole pairs at the origin of the signal of the structure are generated forms the first zone 210 of the structure 1.

The first layer 200 has a first and a second face 201, 202, the first face 201 being the face by which the first layer 200 is in contact with the support 100. The first layer 200 is in contact by its second face 202, which is opposite its first face 201, with a second semiconductor layer 300. The second layer 300 comprises a first face 301 by which it is in contact with the second face 202 of the first layer 100.

The second layer 300 is a semiconductor layer of which a portion, which forms the second zone 310, is suitable for, during operation of the structure 1, forming a carrier multiplication layer. To obtain such an adaptation, the portion of the second semiconductor layer 300 that forms the second zone 310 comprises a majority carrier concentration that is at least 10 times lower than that of the first zone 210 and preferably 50 times lower. The second layer 200, according to the operating constraints of the structure 1, can have the first type of conductivity or a second type of conductivity that is opposite the first type of conductivity.

According to another possibility of the invention, the portion of the second layer 300 that forms the second zone 310 can be of the intrinsic type or of the unintentionally doped type.

By "of the intrinsic type", we mean that the portion of the second layer 300, which forms the major part 320 of the second zone 310, comprises a concentration of carriers of a first type that is substantially identical to the concentration of carriers of a second type that is opposite the first type of carrier.

The second layer 300, at least for its portion that forms the second zone 310, has a forbidden energy gap that is suitable for optimizing, during operation of the structure 1, the carrier multiplication rate during their transit into said second layer 310.

Similarly, the thickness of the second layer 300 is great enough for the structure 1 to have a multiplication rate of carriers generated in the first layer 200 suitable for providing a measurable signal.

According to a possibility of the invention, the second layer 300 comprises a forbidden energy gap lower than that of the first semiconductor zone 210. According to this possibility, the forbidden energy gap of the second layer 300 is suitable for promoting the absorption of the electromagnetic radiation in a second wavelength range of which the energy is lower than the given wavelength range. With such a possibility, the structure 1 makes it possible, during operation, to detect and measure radiation of which the wavelength is within the second wavelength range in addition to the measurement of electromagnetic radiation at the given wavelength.

In the specific application, the portion of the second layer 300 that forms the major part 320 of the second zone 310 is made of a mercury-cadmium telluride $Cd_xHg_{1-x}Te$ of which the cadmium proportion x between 0.42 and 0.2. and preferably between 0.4 and 0.29 in order to provide a second wavelength range including thermal radiation. In this same specific application, the second layer 300, at least over its portion forming the major part 320 of the second zone 310, has a type of conductivity opposite that of the first zone 210 and is therefore a type of conductivity for which the majority carriers are electrons. The majority carrier concentration of the portion of the second layer 300 forming the second zone 310 is between $10^{14}$ and $10^{15}$ cm$^{-3}$.

Above, by "thermal radiation", we mean the far infrared wavelength range of between 3 and 10 μm.

According to the specific application, the thickness of the second layer 300 is between 0.5 and 2 μm.

The cavity 520 is provided in the second layer 300 so as to laterally delimit the second zone 310. Thus, the cavity 520 passes through the second layer 300 over its entire thickness. The cavity 520 forms means for lateral delimitation of the second zone 310 suitable for laterally delimiting the second zone 520. The cavity 520 is at least partially filled by the passivation layer 620.

The second layer 300 also comprises the third semiconductor zone 410.

The third zone 410 has the second type of conductivity, which is opposite the first type of conductivity. The third zone 410 comprises a majority carrier concentration at least 10 times, and preferably 50 times, greater than that of the second zone 310.

The forbidden energy gap of the third zone 410 is substantially identical to that of the second semiconductor layer 300.

In the specific application, the third zone 410 has the same type of conductivity as that of the second zone 310. The majority carrier concentration is between $10^{16}$ and $10^{18}$ cm$^{-3}$.

The second semiconductor layer 300 is in contact on its face that is opposite the first layer 200 with the passivation layer 620.

The passivation layer 620 extends along the second layer 300. The passivation layer 620 is preferably made of an insulating material, such as, for example, silicon oxide.

The passivation layer 620 has a through-opening communicating with the part of the adaptation layer 610 comprising the third zone 410.

In the specific application, the passivation layer 620 is made of zinc sulfide ZnS.

The electric contact 710 is in contact with the third zone 410 through the opening provided in the passivation layer 620.

The electric contact 710 is made of a conductive material, generally metallic, suitable for forming an ohmic contact with the third semiconductor zone 410.

It can finally be noted that the structure 1 also comprises, although not shown in FIG. 1, second polarization means, which can be an electric contact passing through the passivation layer 620 and the second layer 300 so as to be in electrical contact with the first layer 200. As the first layer 200 generally has a majority carrier concentration sufficient for making it conductive, the structure 1 being one of a plurality of structures, the second means can be a second collective electric contact suitable for polarizing a plurality of structures.

Such a structure 1, when it is a structure according to the specific application, can be formed by a production process comprising the steps consisting of:
 providing a semiconductor support 100 and the first semiconductor layer 200, the first layer comprising a first and a second face 201, 202, the first layer 200 being made of mercury-cadmium telluride of the $Cd_xHg_{1-x}Te$ type with a cadmium proportion x that is reduced in the direction of the second zone along an axis substantially perpendicular to the first longitudinal face 201, the first layer 200 having the first type of conductivity with an arsenic concentration that is varied alternately between the high concentration and the low concentration,
 forming the second layer 300 in contact with the second face 202 of the first layer 200, the second layer 300 comprising a first and a second face 301, 302, and being in contact with the first layer 200 by its first face 301,
 forming the passivation layer 620 on the face of the second layer 300 that is opposite the first layer 200,
 selectively implanting, with doping elements, the portion of the second layer 300 that is intended to form the third semiconductor zone 410 and thus forming the third zone 410,
 forming, in the passivation layer 620, a through-opening communicating with the third zone 410,
 forming the electric contact 710 through the opening of the passivation layer 620 and in electric contact with the third zone 410,
 forming the second polarization means suitable for polarizing the first semiconductor zone 210.

The step of providing the support and the second layer includes sub-steps consisting of:
 providing a support 100 comprising a longitudinal surface,
 depositing, in contact with the longitudinal surface of the support 100, mercury-cadmium telluride of the $Cd_xHg_{1-x}Te$ type by varying the cadmium proportion x, introducing the doping element, which is arsenic, into it with an arsenic concentration that is varied alternately in the direction substantially perpendicular to the longitudinal surface, which represents a first longitudinal face 201, between a so-called low concentration and a so-called high concentration.

In this last sub-step, the cadmium concentration x is reduced in the direction of the second zone 310 along an axis substantially perpendicular to the first longitudinal face 201.

In operation, the structure 1 has a high reverse polarization, i.e. for a first and a third zone 210, 410, each having a type of conduction in which the majority carriers are respectively holes and electrons, the first zone 210 is highly negatively polarized with respect to the third zone 410. Thus, the semiconductor junction located at the interface between the first and the second zone 210, 310, and the second zone 310 having a low majority carrier concentration with respect to the first zone 210, the drop in potential is distributed primarily along the second semiconductor zone 310.

When a photon of electromagnetic radiation of which the wavelength is within the given wavelength range enters the first zone 210, its absorption generates, in the first zone 210, an electron-hole pair. The electron and the hole thus generated are separated from one another by the electric field generated by the variation in the cadmium proportion along the first zone 210. The electron, accelerated by the field, passes through toward the second zone 310.

In the second zone 310, due to the material that constitutes it and the electric field in it, the electron will produce multiple impact ionizations and therefore form a current of multiple electrons, which is then collected by the third zone 410.

Thus, because of the electric field in the first zone, the transit time of the electron in the first zone 210 is reduced and therefore leads to a reduction in the response time with respect to a structure 1 having a first zone according to the prior art.

Figure 4:
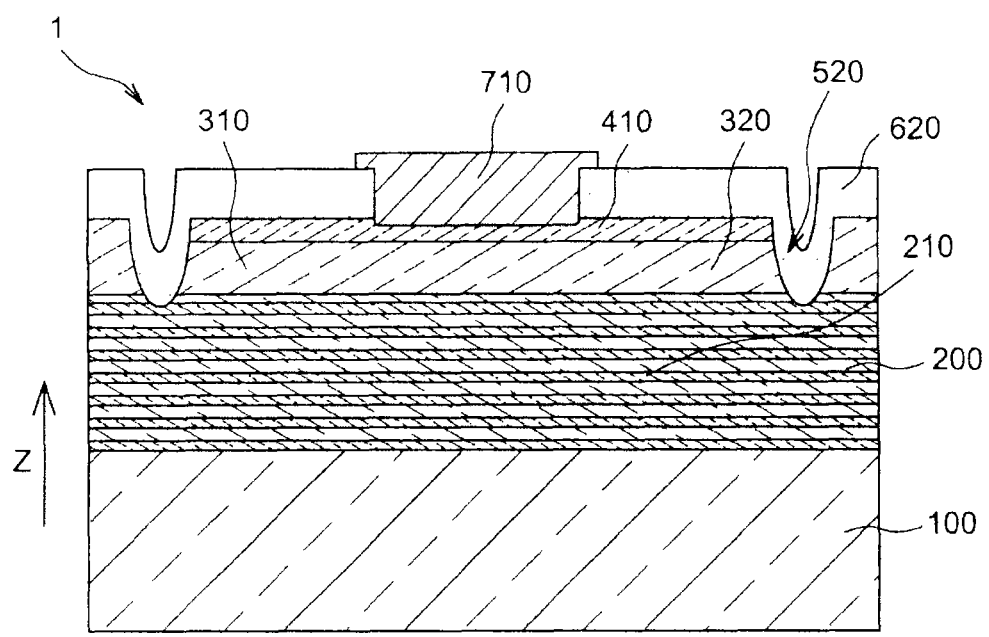
FIG. 4 shows a cross-section view of a structure according to a second embodiment of the invention in which the structure comprises a third semiconductor zone that extends over the entire width of the second semiconductor zone.

FIG. 4 shows a structure 1 according to a second embodiment of the invention in which the third zone 410 extends over the entire width of the second zone 310. A structure 1 according to this second embodiment differs from a structure 1 according to the first embodiment in that the third zone 410 extends over the entire width of the second zone 310 and in that the third zone 410 forms an interface between the passivation layer 620 and the second zone 310.

The third zone 410 is provided in a portion of the second layer 300.

A process for producing a structure 1 according to this second embodiment differs from a process according to the first embodiment in that, in the step of implanting a portion of the second layer 300, the implantation is performed over the entire width of the second zone 310 over a part of the height of the second zone 310.

A structure 1 according to this second embodiment operates according to a principle substantially identical to that of a structure 1 according to the first embodiment.

Figure 5:
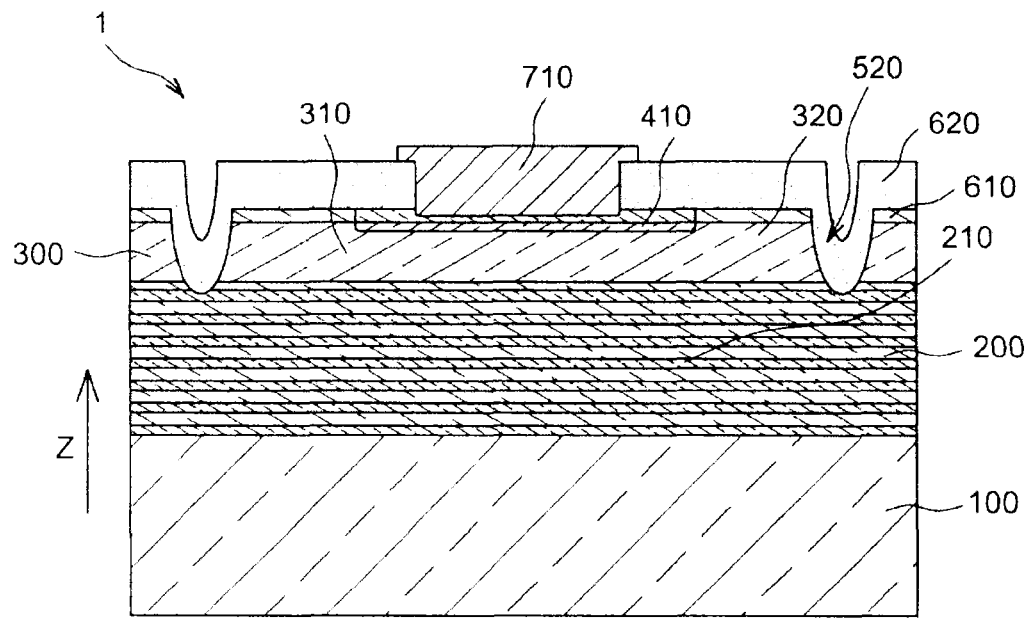
FIG. 5 shows a cross-section view of a structure according to a third embodiment of the invention in which the structure comprises an adaptation layer.

FIG. 5 shows a structure 1 according to a third embodiment of the invention in which the structure 1 comprises an adaptation layer 610. A structure 1 according to this third embodiment differs from a structure 1 according to the first embodiment in that the second zone 310 is provided both in the second layer 300 and in the adaptation layer 610, the first and the second sub-parts being parts of the major part of the second zone 310 located in the second layer 300.

In this third embodiment, the second semiconductor layer 300 comprises a second face 302 that is opposite the first face 301. The second layer 300 is in contact by its second face 302 with the adaptation layer 610.

The adaptation layer 610 is a third semiconductor layer that is suitable for forming a good interface between the second semiconductor layer 300 and the passivation layer 620. To this effect, the adaptation layer 610 has an intermediate forbidden energy gap between that of the major part 320 of the second zone 310 and the forbidden energy gap of the passivation layer 620.

The adaptation layer 610 has the second type of conductivity. The adaptation layer 610 comprises, excluding its portion forming the third semiconductor zone 410, a majority carrier concentration that is on the same order of amplitude as that of the major part 320 of the second zone 310 and preferably substantially equal to that of the major part 320 of the second zone 310. Thus, the adaptation layer 610 comprises a minor part 330 of the second semiconductor zone 310 by which the second zone 310 is in contact with the passivation layer 620.

In the specific application, the adaptation layer 610 is made of a mercury-cadmium telluride of the $Cd_xHg_{1-x}Te$ type with the cadmium proportion x that is between 0.7 and 0.4. In this specific application, the adaptation layer 610 has the same type of conductivity as that of the second zone 310 and is therefore a type of conductivity for which the majority carriers are electrons. The majority carrier concentration in the adaptation layer 610 is substantially equal to that of the second zone 310 and is therefore between $10^{14}$ and $10^{15}$ cm$^{-3}$.

The adaptation layer 610 comprises a part of the third semiconductor zone 410. The third zone 410 is partially formed in the second layer 300, in contact with the second zone 310, the remainder of the third zone 410 being contained in the adaptation layer 610.

The cavity 520, according to this third embodiment, also passes through the adaptation layer 610.

Figure 6:
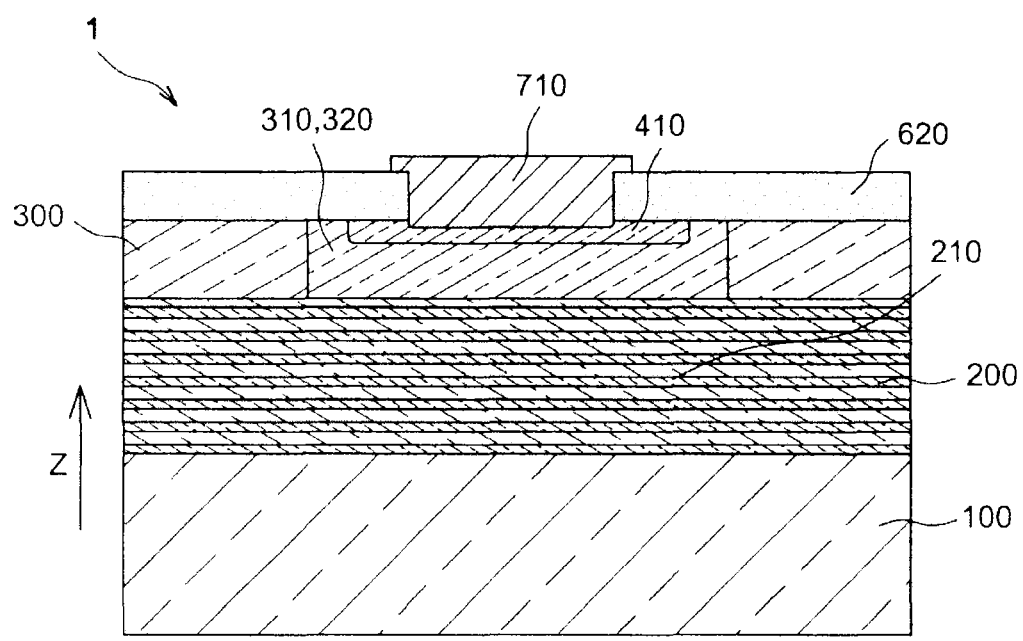
FIG. 6 shows a cross-section view of a structure according to a fourth embodiment of the invention in which the structure is laterally delimited by the doping of the carrier multiplication zone.

FIG. 6 shows a structure according to a fourth embodiment of the invention in which the structure does not comprise a cavity, the second zone being delimited by a zone of which the conductivity is modified. A structure according to this fourth embodiment differs from a structure according to the first embodiment in that the second zone is delimited by a zone of which the conductivity is of the second type of conductivity, with the remainder of the second semiconductor layer having the first type of conductivity.

Thus, in this embodiment for the specific application of the invention, the lateral delimitation can be obtained by generating a doping source with the first type of conductivity in the first and second layers 200, 300. This can in particular be produced by a complementary doping provided by generating mercury vacancies (VHg) that are associated with acceptor levels, i.e. providing holes. A conductivity provided by mercury vacancies makes it possible, during the formation of the contact zone 410 by implantation of doping elements, to form a weak doping zone, at the residual doping level that extends from the collection zone 310. In this last embodiment of the invention, it is the zone 310 thus formed that will constitute the multiplication zone, which is laterally delimited by the unfilled mercury vacancies and vertically delimited by the second layer 200.

The invention claimed is:

1. An avalanche photodiode-type semiconductor structure configured to receive electromagnetic radiation in a given wavelength and comprising:
    a first semiconductor zone, called an absorption zone, with a first type of conductivity having a first longitudinal face intended to receive the electromagnetic radiation and a second face opposite the first face, said first zone being made of mercury-cadmium telluride of the $Cd_xHg_{1-x}Te$ type with a cadmium proportion x that is varied,
    at least one second semiconductor zone, called a multiplication zone, in contact on a first longitudinal face with the second face of the first zone, the second zone having a majority carrier concentration lower than that of the first zone, said second zone being adapted so as to provide a multiplication of carriers by impact ionization,
    a third semiconductor zone, called a collection zone, in contact with the second zone, said third zone having a second type of conductivity opposite the first type of conductivity and having a majority carrier concentration higher than that of the second semiconductor zone,
    wherein the first zone comprises a doping element providing at least one majority carrier corresponding to the first type of conductivity, of which the concentration is varied alternately in a direction substantially perpendicular to the first longitudinal face between a so-called low concentration and a so-called high concentration.

2. The structure according to claim 1, wherein the first zone comprises a cadmium portion x that is reduced in the direction of the second zone along an axis substantially perpendicular to the first longitudinal face.

3. The structure according to claim 1, wherein the low concentration of doping element can be substantially zero.

4. The structure according to claim 1, wherein the alternation between the low concentration and the high concentration in the first zone is substantially periodic.

5. The structure according to claim 4, wherein each period comprises a first part corresponding to the high concentration and a second part corresponding to the low concentration, the dimensional ratio between the first part and the second part in the direction perpendicular to the first longitudinal face being a maximum of 10.

6. The structure according to claim 1, wherein the first zone is in contact with the second zone by a region substantially free of doping element.

7. The structure according to claim 1, wherein the doping element is arsenic.

8. A method for producing a structure, said method comprising:
    providing a first semiconductor zone with a first type of conductivity having a first longitudinal face intended to receive the electromagnetic radiation and a second face opposite the first face, said first zone being made of mercury-cadmium telluride of the $Cd_xHg_{1-x}Te$ type with a cadmium proportion x that is varied, the first zone comprising a doping element of which the concentration is varied alternately in the direction perpendicular to the first longitudinal face between a so-called low concentration and a so-called high concentration,
    forming a second semiconductor zone in contact with the second face of the first zone, the second zone having a majority carrier concentration lower than that of the first zone,
    forming a third semiconductor zone in contact with the second zone, said third zone having a second type of conductivity opposite the first type of conductivity and having a majority carrier concentration greater than that of the second zone.

9. The method according to claim 8, wherein the step of providing the first zone comprises:
    providing a support comprising a longitudinal surface,
    depositing, on the longitudinal surface of the support, mercury-cadmium telluride of the $Cd_xHg_{1-x}Te$ type by varying the cadmium proportion x and introducing the doping element into it with a concentration that is varied alternately in the direction substantially perpendicular to the longitudinal surface between a so-called low concentration and a so-called high concentration.

10. The method according to claim 9, wherein, during the sub-step consisting of depositing the mercury-cadmium telluride in contact with the support, the doping element concentration is varied substantially periodically.

11. The method according to claim 8, wherein the doping element providing at least one majority carrier can be arsenic.

* * * * *